US008048792B2

(12) United States Patent
Beyer et al.

(10) Patent No.: US 8,048,792 B2
(45) Date of Patent: Nov. 1, 2011

(54) SUPERIOR FILL CONDITIONS IN A REPLACEMENT GATE APPROACH BY CORNER ROUNDING PRIOR TO COMPLETELY REMOVING A PLACEHOLDER MATERIAL

(75) Inventors: Sven Beyer, Dresden (DE); Klaus Hempel, Dresden (DE); Andreas Ott, Dresden (DE); Stephan Kruegel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/893,051

(22) Filed: Sep. 29, 2010

(65) Prior Publication Data

US 2011/0073963 A1    Mar. 31, 2011

(30) Foreign Application Priority Data

Sep. 30, 2009   (DE) .......................... 10 2009 047 891

(51) Int. Cl.
*H01L 21/28* (2006.01)
(52) U.S. Cl. ................ 438/595; 257/410; 257/E29.255; 257/E21.19
(58) Field of Classification Search .................. 257/410, 257/770, 774, E21.585, E23.011, E29.028, 257/E29.067, E29.201, E29.214, E29.223, E29.236, E21.176–E21.188
See application file for complete search history.

(56) References Cited

U.S. PATENT DOCUMENTS

| | | | | |
|---|---|---|---|---|
| 5,369,303 | A * | 11/1994 | Wei | 257/751 |
| 7,745,889 | B2 * | 6/2010 | Lin et al. | 257/412 |
| 2002/0096773 | A1 * | 7/2002 | Anezaki et al. | 257/758 |
| 2008/0185637 | A1 | 8/2008 | Nagaoka et al. | 257/327 |

OTHER PUBLICATIONS

Translation of Official Communication from German Patent Office for German Patent Application No. 10 2009 047 891.4 dated Nov. 5, 2010.

* cited by examiner

*Primary Examiner* — A. Sefer
*Assistant Examiner* — Monica D Harrison
(74) *Attorney, Agent, or Firm* — Williams, Morgan & Amerson, P.C.

(57) ABSTRACT

In a replacement gate approach, a superior cross-sectional shape of the gate opening may be achieved by performing a material erosion process in an intermediate state of removing the placeholder material. Consequently, the remaining portion of the placeholder material may efficiently protect the underlying sensitive materials, such as a high-k dielectric material, when performing the corner rounding process sequence.

19 Claims, 6 Drawing Sheets

SUPERIOR FILL CONDITIONS IN A REPLACEMENT GATE APPROACH BY CORNER ROUNDING PRIOR TO COMPLETELY REMOVING A PLACEHOLDER MATERIAL

BACKGROUND OF THE INVENTION

1. Field of the Invention

Generally, the present disclosure relates to the fabrication of sophisticated integrated circuits including transistor elements comprising gate structures on the basis of a high-k gate dielectric material in combination with a metal electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon, due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows for the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

According to this approach, in particular, any threshold variations caused by high temperature processes and the like may be efficiently avoided, thereby contributing to superior uniformity of sophisticated transistor elements. In the replacement gate approach, the polysilicon material is removed on the basis of appropriate etch recipes, such as wet chemical etch processes, which exhibit a high degree of selectivity with respect to the insulating material that laterally delineate the polysilicon material. After the removal of the polysilicon material, an appropriate metal-containing material is deposited in order to form the work function adjusting species above the gate dielectric material as explained above. Typically, P-channel transistors and N-channel transistors require different types of work function adjusting species, which may require a corresponding masking and patterning regime in order to appropriately form the desired work function adjusting material in the gate electrode structures of P-channel transistors and N-channel transistors, respectively. Irrespective of the applied process strategy, after depositing the work function adjusting material layer, at least the actual electrode metal, such as aluminum, has to be filled into the opening, the width of which may, however, be further reduced by the previous deposition of the work function adjusting material, thereby causing significant irregularities, as will be explained with reference to FIGS. 1a-1c.

FIG. 1a schematically illustrates a cross-sectional view of a semiconductor device 100 that comprises a substrate 101, such as a silicon substrate and the like, in or above which is provided a silicon-based semiconductor layer 102. Furthermore, the device 100 comprises a transistor 150, such as a P-channel transistor or an N-channel transistor that may be formed on the basis of critical dimensions of approximately 40 nm and less. Furthermore, a further circuit element 160, such as a field effect transistor, a capacitor and the like, is provided in the semiconductor device 100 and may be formed on the basis of a greater critical dimension. The transistor 150 comprises drain and source regions 151, possibly in combination with metal silicide regions 152. Similarly, the circuit element 160 comprises "drain and source" regions 161 in combination with metal silicide regions 162. Furthermore, the transistor 150 comprises a gate electrode structure 155 which, in the manufacturing stage shown, includes a gate dielectric material 155A formed on the basis of a high-k dielectric material, as discussed above. Furthermore, a sidewall spacer structure 155C is provided and defines an opening 155O having a width that substantially corresponds to a desired length of the gate electrode structure 155. For example, a width of the opening 155O may be 40 nm and less in sophisticated applications. Similarly, the circuit element 160 may comprise a "gate electrode structure" 165 including a gate dielectric material 165A and a spacer structure 165C, which defines an opening 165O. In principle, the gate electrode structures 155, 165 may have the same configuration except for a different width of the opening 165O compared to the opening 155O. Furthermore, a dielectric material 103, for instance in the form of silicon nitride, silicon dioxide and the like, is provided so as to laterally enclose the gate electrode structures 155, 165.

The semiconductor device 100 as illustrated in FIG. 1a may be formed on the basis of the following process techniques. After forming appropriate semiconductor regions in the layer 102, for instance by providing isolation structures (not shown) for receiving the circuit elements 150, 160, the gate dielectric materials 155A, 165A may be formed on the basis of oxidation and/or sophisticated deposition techniques, wherein, typically, a high-k dielectric material is incorporated in the dielectric materials 155A, 165A. For instance, a silicon oxide-based material may frequently be used as a base layer, possibly in combination with other species, such as nitrogen, on which an appropriate high-k dielectric material, such as hafnium oxide and the like, may be deposited. Thereafter, a conductive cap material may be formed in order to enhance integrity of the gate dielectric materials 155A, 165A during the further processing. Thereafter, polysilicon material is deposited on the basis of well-established process recipes, possibly in combination with further cap materials, hard mask materials and the like, as is required for patterning the resulting material layer stack in accordance with the design rules so as to reliably implement the critical dimensions for the gate electrode structure 155. Thereafter, sophisticated patterning processes are applied in order to obtain the gate electrode structures 155, 165, which include the polysilicon material as a placeholder material. Next, the drain and source regions 151, 161 may be formed in combination with the sidewall spacer structures 155C, 165C in order to obtain the desired dopant profile. Furthermore, the spacer structures 155C, 165C may also be used for forming the metal silicide regions 152, 162, thereby completing the basic configuration of the circuit elements 150, 160. Next, the dielectric material 103, also referred to as an interlayer dielectric material, is formed, for instance, by depositing silicon nitride followed by silicon dioxide and the like. Thereafter, any excess material may be removed and an upper surface of the gate electrode structures 155, 165 is exposed, for instance by a polishing process, such as chemical mechanical polishing (CMP). Next, an etch process, such as a highly selective wet chemical etch process, is performed to remove the exposed polysilicon material selectively to the dielectric material 103 and the sidewall spacer structures 155C, 165C, thereby forming the openings 155O, 165O.

FIG. 1b schematically illustrates the semiconductor device 100 with a metal-containing material layer 155D formed on the dielectric material 103 and in the openings 155O, 165O. The material layer 155D comprises one or more layers of different materials, such as titanium nitride, tantalum nitride and the like, wherein an appropriate metal species, such as lanthanum, aluminum and the like, may also be incorporated in order to adjust the resulting work function of the gate electrode structures 155, 165. As previously discussed, depending on the overall process strategy, different material layers may be locally provided in transistors of different conductivity type, thereby requiring the deposition of at least one or more material layers, possibly in combination with additional etch processes for selectively removing one or more of these layers from gate electrode structures of transistors which may require a different type of work function metal species. Irrespective of the process strategy applied, the material 155D may be deposited on the basis of sophisticated deposition techniques, such as chemical vapor deposition (CVD), physical vapor deposition (PVD) and the like, so as to form the material layer 155D reliably at least above the gate dielectric materials 155A, 165A with a thickness as required for appropriately positioning the work function metal species at and in the dielectric materials 155A, 165A. During the deposition of the material 155D, a significant variation of the layer thickness may be created, which may be particularly pronounced in an upper portion of the opening 155O of reduced critical dimension. Thus, while a width 155W of the opening 155O at the bottom thereof may be defined by the local layer thickness that is selected so as to obtain the desired coverage of the gate dielectric material 155A, a width 155R at the top of the opening 155O may be significantly reduced due to corresponding overhangs of the layer 155D. On the other hand, the reduced width 165R at the top area of the opening 165O may not substantially affect the further processing of the device 100. On the other hand, the reduced width 155R, which may be 20 nm and even less for an initial width of the opening 155O of approximately 40 nm, may result in significant irregularities during the further processing when filling in an actual electrode material into the openings 155O, 165O.

FIG. 1c schematically illustrates the semiconductor device 100 after the deposition of an electrode metal 155E, such as aluminum and the like, in order to complete the gate electrode structures 155, 165. Due to the reduced width 155R (FIG. 1b), the opening 155O may not be completely filled or the opening 155O may even remain substantially non-filled, thereby producing a non-functional gate electrode structure for the transistor 150. On the other hand, the opening 165O may be reliably filled due to the less critical width of the opening 165O. Consequently, upon removing any excess material, the gate electrode structures 155, 165 may be completed, however, with a very pronounced probability of creating non-functional gate electrode structures for critical transistor elements, such as the transistor 150. Thus, although in principle the adjustment of the work function of the gate electrode structure 150 in a very advanced manufacturing stage may be advantageous in view of reducing transistor variability in terms of threshold voltage variations, in particular highly scaled transistor elements may suffer from an increased yield loss due to incompletely filled gate electrode structures or non-functional gate electrode structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which a gate placeholder material, such as a polysilicon material and the like, may be efficiently removed in a very advanced manufacturing stage, while at the same time a certain degree of material erosion and thus an increase of a gate opening may be accomplished. For this purpose, a portion of the placeholder material may be maintained and may be used as a protective layer for covering sensitive materials, such as a high-k dielectric material, a very thin "conventional" dielectric material, a conductive cap material and the like, when a top area of the gate opening is subjected to a material erosion process in order to achieve a certain corner rounding, which may significantly enhance process conditions during the subsequent deposition of any further materials, such as work function adjusting species, dielectric materials and in particular of the actual electrode material. After the material erosion process, the remaining portion of the placeholder material may be efficiently removed on the basis of a further etch step, which may be performed on the basis of less critical process conditions, thereby contributing to a superior overall process uniformity for the subsequent deposition of further materials.

One illustrative method disclosed herein comprises forming a first portion of an opening in a gate electrode structure of a transistor by removing a first portion of a placeholder electrode material of the gate electrode structure. The method further comprises increasing a width of the first portion of the opening at a top area thereof in the presence of a second portion of the placeholder electrode material. Furthermore, the method comprises removing the second portion of the placeholder electrode material so as to form the opening, which has the increased width at the top area thereof. The method further comprises forming a material layer in the opening, which comprises a work function adjusting species, and filling a conductive electrode material into the opening.

A further illustrative method disclosed herein comprises removing a first portion of a placeholder electrode material of a gate electrode structure of a transistor, wherein the placeholder electrode material is laterally enclosed by an insulating material. The method further comprises rounding corner areas of the insulating material in the presence of a second portion of the placeholder electrode material. Furthermore, the method comprises removing the second portion by performing a wet chemical etch process so as to form an opening after rounding the corner areas. Finally, a gate electrode is formed in the opening.

One illustrative semiconductor device disclosed herein comprises a gate electrode structure of a transistor formed above a semiconductor region. The gate electrode structure comprises a gate insulation layer including a high-k dielectric material and comprises an electrode material formed on the gate insulation layer and having a tapered cross-sectional configuration. The gate electrode structure further comprises a work function adjusting material layer formed on sidewalls of the electrode material, wherein a thickness of the work function adjusting material layer has a variation of less than ten percent along the sidewalls.

BRIEF DESCRIPTION OF THE DRAWINGS

The disclosure may be understood by reference to the following description taken in conjunction with the accompanying drawings, in which like reference numerals identify like elements, and in which.

Figure 1A:
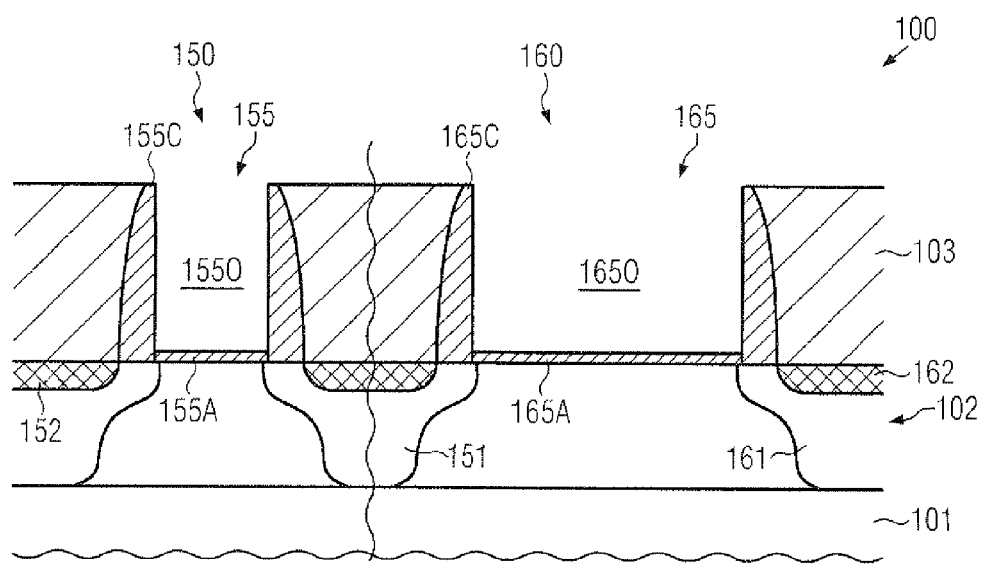
FIGS. 1a-1c schematically illustrate cross-sectional views of a semiconductor device including a transistor with critical dimensions of approximately 40 nm and less in combination with other circuit elements during various manufacturing stages in a replacement gate approach resulting in very sophisticated conditions during the deposition of the replacement electrode material, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the refilling of an opening in gate electrode structures may be performed on the basis of a superior cross-sectional shape of the opening, thereby substantially avoiding or at least reducing deposition-related irregularities, such as voids, in the final electrode material, as may frequently be encountered in sophisticated semiconductor devices in which metal gate electrodes are provided in a very advanced manufacturing stage. The superior cross-sectional shape of the gate opening may be obtained by performing a material erosion process, such as a plasma assisted etch process, a particle bombardment, for instance an ion sputter process, and the like. The material erosion process may be performed in an intermediate stage of the removal of the placeholder material so as to reliably cover a bottom of the gate opening during the material erosion process. Consequently, any sensitive materials positioned at the bottom of the gate opening, such as a very thin conventional dielectric material, a high-k dielectric material, a sensitive conductive cap material and the like, may not be unduly exposed to the process ambient required for the material erosion. Moreover, the removal of the remaining portion of the placeholder electrode material may be accomplished on the basis of superior process conditions, such as a tapered cross-sectional shape of the first part of the gate opening so that superior uniformity may be accomplished during a final phase of the etch process for exposing the underlying sensitive materials. Consequently, the amount of the material residues of the placeholder material may be significantly reduced for a given over-etch time during the preceding removal of the second portion of the placeholder material, which may thus result in superior deposition and thus device uniformity upon forming further materials in the gate opening. Due to the presence of at least a portion of the placeholder electrode material upon performing the material erosion process, any additional efficient cleaning processes may also be performed in order to provide superior surface conditions for the subsequent removal of the remaining portion of the placeholder material, thereby providing a high degree of flexibility in selecting an appropriate process technique for achieving the desired superior cross-sectional shape of the gate opening. That is, plasma assisted etch processes on the basis of any appropriate chemicals may be applied wherein any etch byproducts may be efficiently removed by using efficient cleaning recipes without exposing any sensitive material to these reactive process conditions. In other cases, a material erosion induced by a particle bombardment may be efficiently applied, wherein any byproducts may also be removed prior to removing the remaining portion of the placeholder material. In some cases, material erosion processes based on a polishing process may be efficiently applied in order to obtain a certain degree of corner rounding, wherein, also in this case, any byproducts of the preceding polishing process may be efficiently removed prior to continuing the removal of the placeholder material. Consequently, by maintaining a portion of the placeholder material in the gate opening, process uniformity and thus uniformity of device characteristics of sophisticated transistor elements may be enhanced without unduly affecting the characteristics of any previously deposited material or material systems in the gate electrode structure.

Figure 1B:
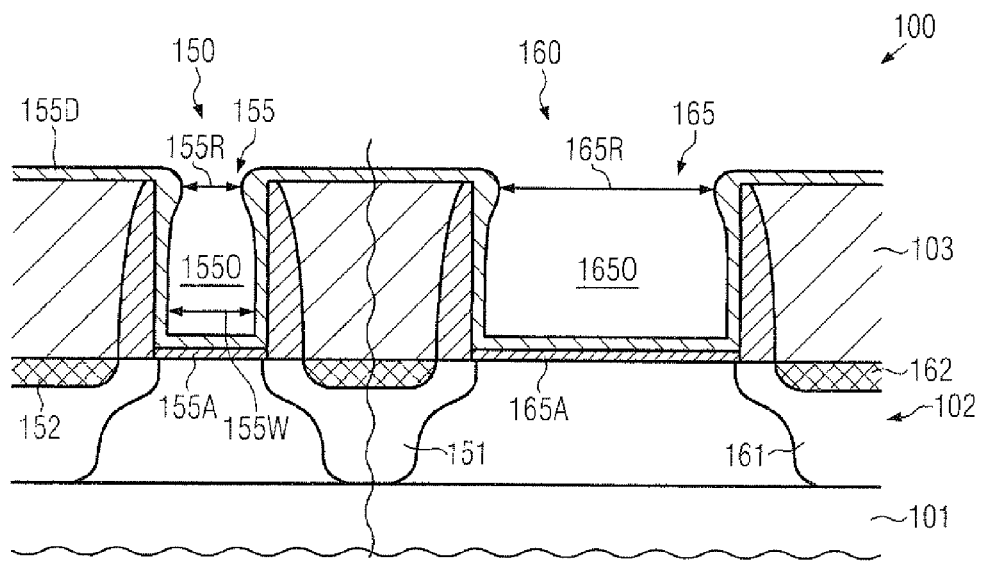
Figure 1C:
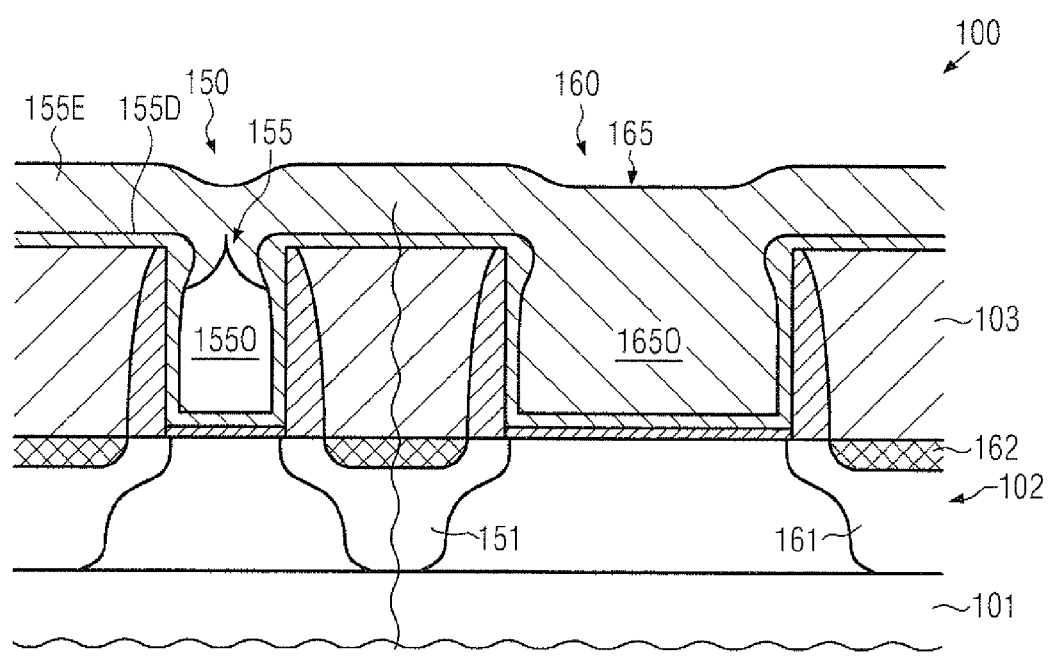

With reference to FIGS. 2a-2g, further illustrative embodiments will now be described in more detail, wherein reference may also be made to FIGS. 1a-1c, if appropriate.

Figure 2A:
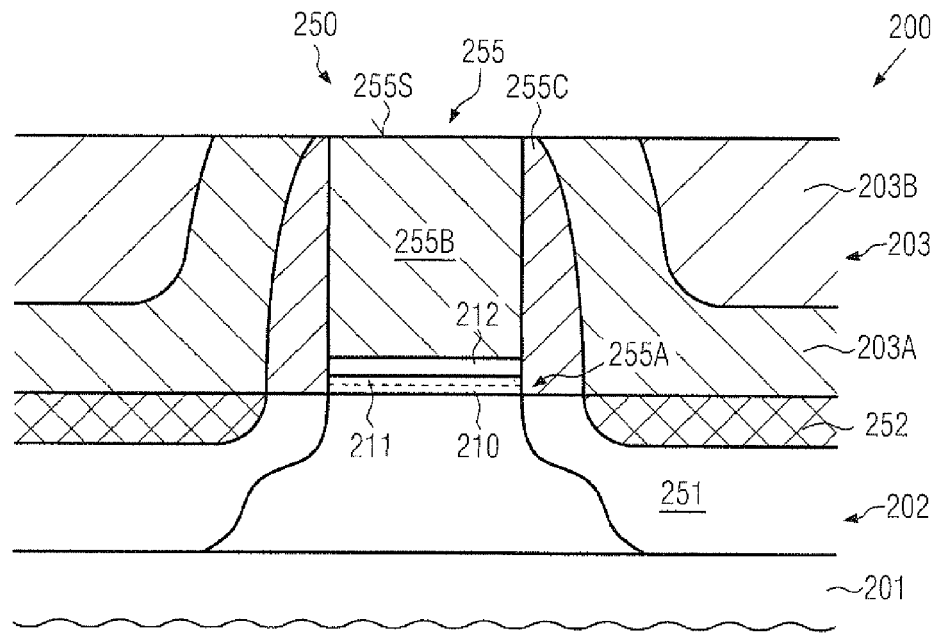
FIGS. 2a-2g schematically illustrate cross-sectional views of a semiconductor device during various manufacturing stages when applying a replacement gate approach on the basis of a split placeholder material removal process with an intermediate corner rounding process, according to illustrative embodiments.

FIG. 2a schematically illustrates a cross-sectional view of a semiconductor device 200 comprising a substrate 201 above which is formed a semiconductor layer 202. The substrate 201 and the semiconductor layer 202 may be provided in the form of any appropriate material system, as is, for instance, also described above when referring to the semiconductor device 100. For example, the layer 202 in combination with the substrate 201 may represent a silicon-on-insulator (SOI) configuration when a buried insulating material (not shown) is formed below and adjacent to the semiconductor layer 202. Furthermore, the layer 202 may have any appropriate configuration so as to form therein and thereabove circuit elements, such as transistors, capacitors, resistors and the like. In the embodiment shown, a transistor 250 may be formed in and above a portion of the semiconductor layer 202 on the basis of design dimensions requiring critical dimensions of approximately 40 nm and less, if sophisticated applications are considered. It should be appreciated that other circuit elements, such as transistors of less critical dimensions, capacitors and the like, may also be provided in and above the semiconductor layer 202, as is, for instance, explained above with reference to the semiconductor device 100. As also explained above, a replacement gate approach may be critical for transistors having the minimum lateral dimensions, while the corresponding process sequence may be less critical for circuit elements of greater critical dimensions so that the transistor 250 may be considered as a circuit element requiring minimum critical dimensions for the technology standard under consideration. The transistor 250 may comprise drain and source regions 251, possibly in combination with metal silicide regions 252, if the semiconductor layer 202 may comprise a significant amount of silicon. Moreover, a gate electrode structure 255 may be provided in this manufacturing stage and may comprise a material system 255A, which may comprise a gate dielectric material and any other additional materials as required by the process strategy applied for forming the transistor 250. For example, as discussed above, the material system 255A may comprise a high-k dielectric material (having a dielectric constant greater than 10.0), for instance in the form of any of the above-specified materials, such as hafnium oxide and the like, possibly in combination with a "conventional" dielectric material, such as silicon oxide, nitrogen-containing silicon oxide and the like. For example, as illustrated in FIG. 2a, silicon oxide-based material 210 with a thickness of approximately 0.8 nm may be provided, followed by a high-k dielectric material 211, which may be covered by a conductive cap layer 212, such as a titanium nitride material and the like. It should be appreciated, however, that the material system 255A may have any other appropriate configuration so as to enable the formation of a highly efficient gate electrode structure on the basis of the structure 255, as shown in FIG. 2a. Furthermore, the gate electrode structure 255 may comprise a placeholder electrode material 255B, which may be understood as any material or composition of materials that may be required for obtaining the structure 255 as illustrated in FIG. 2a. For example, the placeholder material 255B may be comprised of polysilicon material, polysilicon/germanium and the like, depending on the overall process strategy. Furthermore, the placeholder material 255B and the material system 255A may be laterally enclosed by a sidewall spacer structure 255C, which may have any appropriate configuration, such as silicon dioxide-based etch stop liner materials in combination with one or more silicon nitride spacer elements. For example, the spacer structure 255C, or at least a portion thereof, in combination with the cap layer 212, may provide confinement of sensitive materials, such as a high-k dielectric material, for instance in the form of the material layer 211 and the like. Furthermore, in the manufacturing stage shown, the gate electrode structure 255 may be laterally surrounded by a dielectric material 203, which may comprise two or more different materials, which may depend on the overall configuration of the device 200. For instance, the dielectric material 203, which may also be referred to as interlayer dielectric material, may comprise a first dielectric layer 203A, such as a silicon nitride material, possibly having a high internal stress level, and may also comprise a second dielectric layer 203B, for instance in the form of a silicon oxide material. It should be appreciated, however, that the dielectric material 203 may be comprised of a single continuous material or may comprise three or more individual material layers, as required.

The semiconductor device 200 as illustrated in FIG. 2a may be formed on the basis of the following processes. After defining appropriate semiconductor areas in the layer 202, for instance by forming isolation structures (not shown), the basic dopant concentration may be generated in the corresponding semiconductor regions, thereby also adjusting the conductivity type of the transistor 250. Thereafter, the gate electrode structure 255 may be formed by providing materials for the system 255A in combination with the placeholder material 255B, which may be accomplished on the basis of any appropriate process techniques, such as oxidation, thermally activated CVD, plasma enhanced CVD, atomic layer deposition (ALD) and the like. For example, a silicon oxide-based material may be formed by oxidation and/or deposition followed by any further treatments, if required, in order to obtain a desired base material. Thereafter, a high-k dielectric material, such as hafnium oxide and the like, may be deposited with a desired thickness, such as one to several nanometers, followed by the deposition of a cap material, such as the layer 212, if required. Thereafter, the placeholder electrode material 255B may be deposited, for instance in the form of amorphous or polycrystalline silicon, germanium and the like, followed by the deposition of any further materials, such as dielectric cap materials, hard mask materials and the like. The resulting material layer stack may then be patterned by using sophisticated lithography and etch techniques, followed by the formation of a part of the sidewall spacer structure 255C, for instance by providing a silicon nitride spacer element (not shown) and the like. Consequently, after the sophisticated process sequence for forming the material system 255A and the placeholder material 255B, a length of the gate electrode structure 255 may be essentially determined by the horizontal extension of the placeholder material 255B, which may require dimensions of 50 nm and less, as discussed above. Thereafter, the drain and source regions 251 in combination with a remaining portion of the spacer structure 255C may be formed on the basis of any appropriate process technique. The metal silicide regions 252, if required, may be formed by any appropriate silicidation process sequence, wherein, if desired, the material 255B may be efficiently protected by any appropriate dielectric cap material. In other cases, if a corresponding metal silicide may be considered appropriate for the further processing of the device 200, metal silicide may also be formed in the material 255B. Upon forming the metal silicide regions 252, the basic transistor configuration may be completed and thus any high temperature processes required for activating dopant species in the drain and source regions 251 and for obtaining the metal silicide regions 252 may no longer be required and hence a final adjustment of sensitive transistor characteristics, such as the threshold voltage, may be achieved by removing the placeholder material 255B and depositing an appropriate work function adjusting species, as previously explained. For this purpose, the dielectric material 203 may be deposited on the basis of any appropriate deposition technique with a desired composition and the resulting surface topography may be planarized so as to expose a surface 255S of the electrode material 255B. For example, a chemical mechanical polishing (CMP) process may be applied in order to obtain the configuration as shown in FIG. 2a.

Figure 2B:
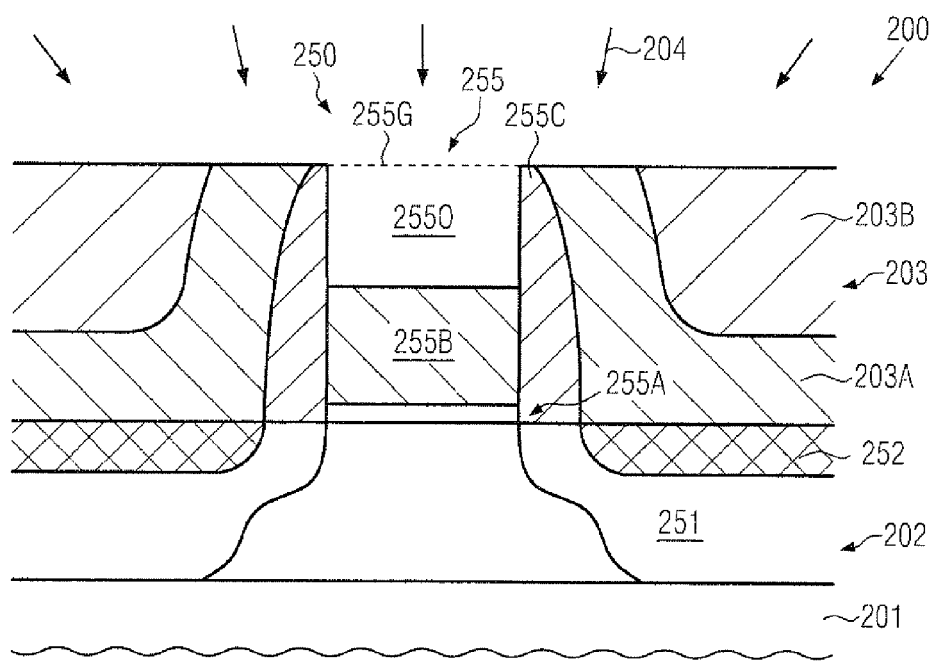

FIG. 2b schematically illustrates the semiconductor device 200 during a selective etch process 204 in which a first portion 255G of the placeholder material 255B may be removed, thereby forming a first portion of an opening 255O. The etch process 204 may be performed, in one illustrative embodiment, on the basis of a wet chemical etch recipe, for instance using any appropriate reactive components so as to remove the material 255B selectively to the surrounding dielectric materials. For example, a plurality of base materials may be used to efficiently remove silicon material with a pronounced selectivity with respect to silicon dioxide, silicon nitride and the like. In other cases, TMAH (tetramethyl ammonium hydroxide) may be used, which is a well-known chemical for removing resist material which, however, may also be applied at elevated temperatures with a higher concentration, thereby efficiently removing silicon material with a high degree of selectivity to silicon dioxide and silicon nitride. Consequently, during the etch process 204, the first portion 255G may be efficiently removed while nevertheless maintaining a significant amount of the material 255B, thereby reliably covering the material system 255A. A corresponding control of the etch process 204 may be accomplished by performing experiments and determining an etch rate for the respective geometric configuration of the device 200 in order to maintain a sufficient thickness of the material 255B. In one illustrative embodiment, the thickness of the material 255B may be approximately 30 nm.

Figure 2C:
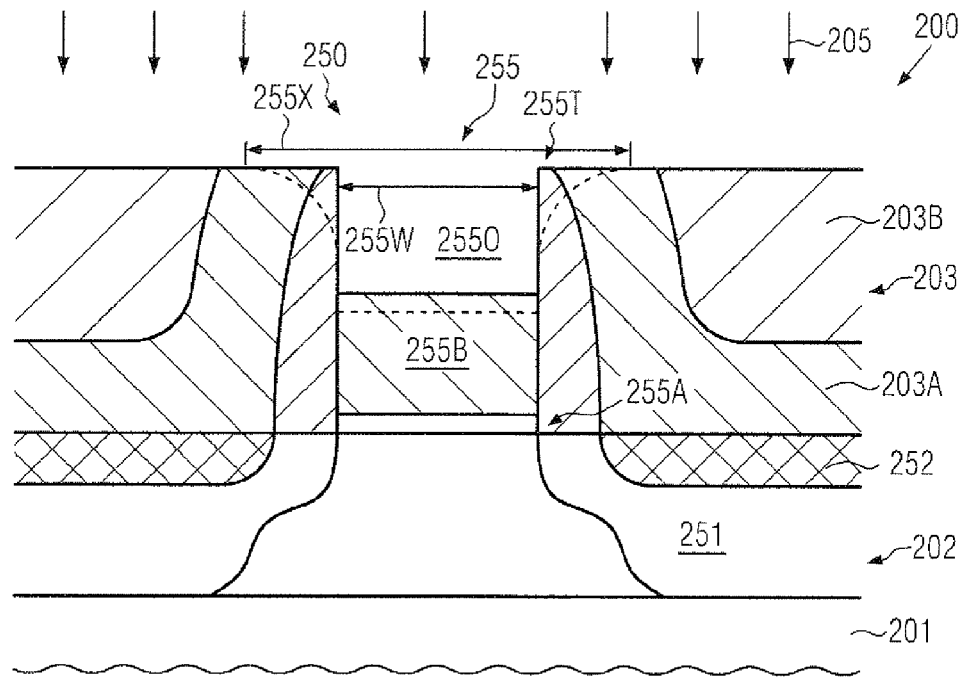

FIG. 2c schematically illustrates the device 200 when subjected to a material erosion process 205 in which an initial width 255W, which may substantially correspond to an initial gate length of the gate electrode structure 255, may be increased so as to obtain an increased width 255X at a top area 255T of the gate electrode structure 255. For this purpose, the material erosion process 205, which may also be referred to as a corner rounding process, is appropriately designed in order to preferably remove material at corners of the opening 255O in the top area 255T, which, in some illustrative embodiments, may be accomplished on the basis of a plasma assisted etch process in which any appropriate reactive components, such as fluorine, chlorine and the like, may be applied. Furthermore, an etch recipe may be selected that may exhibit a moderately reduced etch rate for the dielectric material 203, wherein, nevertheless, at the top area 255T, a significant erosion at the corners may be induced, thereby obtaining the increased width 255X, the magnitude of which may be controlled on the basis of respective process conditions during the process 205 and the duration of the exposure to the process 205. For example, a plurality of plasma assisted etch recipes are well established in the art for removing materials such as silicon with only a moderately low selectivity with respect to silicon dioxide and silicon nitride, thereby obtaining the desired corner rounding effect, while the remaining portion, also indicated as portion 255B, may reliably cover the material system 255A, thereby avoiding an interaction between the reactive ambient of the process 205 and the sensitive materials. It should be appreciated that appropriate process parameters, for instance in the form of plasma power, composition of the gaseous ambient, pressure, temperature and the like, may be readily identified on the basis of experiments, wherein, in general, a very reduced overall etch rate may enable a superior process control on the basis of the etch time during the process 205.

In other illustrative embodiments, the material erosion process 205 may be performed by applying a particle bombardment, such as an ion bombardment in the form of an ion sputter process. In an ion sputter process, particles may be accelerated towards a target, such as the surface of the device 200, with an appropriate acceleration voltage, thereby imparting sufficient kinetic energy to the particles in order to physically release atoms or molecules from the sputter surface. Since generally a number of incoming particles may be higher at the corners of the top area 255T, also in this case a pronounced corner rounding may be achieved. Also in this case, appropriate process parameters may be readily determined by performing experiments so as to identify a removal rate and a degree of corner rounding for various different process parameter settings.

In some illustrative embodiments, the material erosion process 205 may represent a selective plasma assisted etch process for removing a portion of the material 255B without performing the etch process 204 (FIG. 2b) so that, during the advance of the etch process 205, an increasing degree of corner rounding may be accomplished, while also efficiently removing a portion of the placeholder material 255B. For example, selective plasma assisted etch recipes for removing silicon material are well established in the art and may also be used upon patterning the gate electrode structure 255 in an early manufacturing stage, as described above.

Figure 2D:
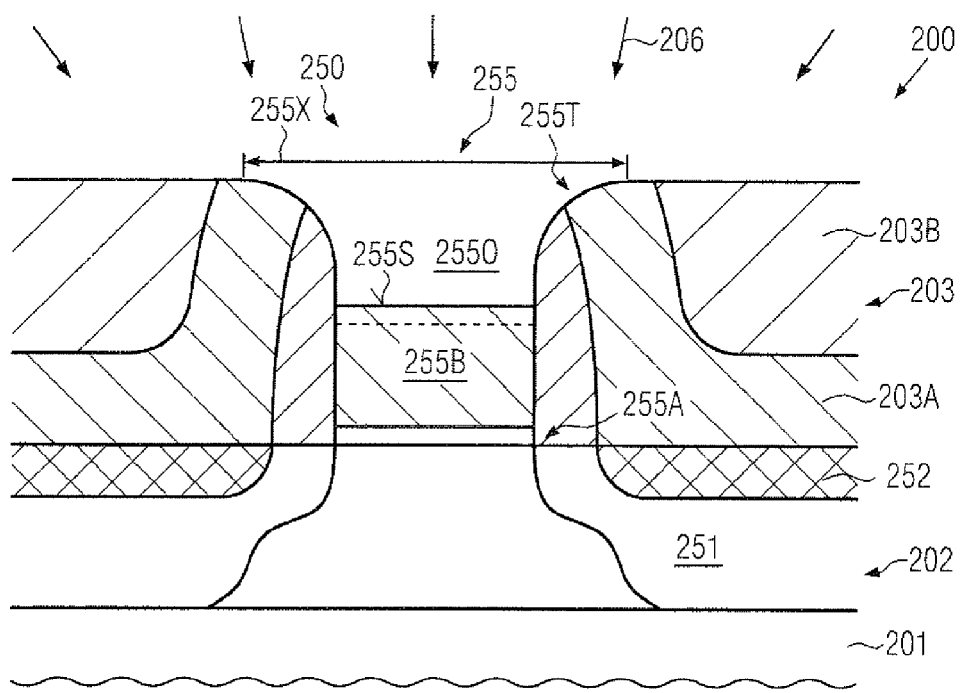

FIG. 2d schematically illustrates the semiconductor device 200 in a further advanced manufacturing stage in which a wet chemical process may be performed. In one illustrative embodiment, the process 206 may comprise a cleaning process for removing any byproducts of the previously performed material erosion process 205 of FIG. 2c, thereby removing contaminants such as polymer residues and the like, as may typically be created during a plasma assisted etch process. Consequently, during the corresponding wet chemical cleaning process, the surface 255S of the remaining portion of the material 255B may be efficiently prepared for a subsequent etch process for removing the material 255B. In other illustrative embodiments, the process 206 may represent a wet chemical etch process without any specific cleaning phase in order to remove the remaining portion of the material 255B. For example, TMAH, possibly in combination with a preceding wet chemical cleaning process, may be applied in order to efficiently remove the material 255B, as is also previously explained. In other cases, any other appropriate wet chemical etch recipe may be applied in order to remove the material 255B, thereby substantially avoiding or at least reducing any undue interaction of the material system 255A with a reactive process ambient. That is, wet chemical etch recipes may exhibit a high degree of selectivity with respect to certain materials, such as titanium nitride, high-k dielectrics and the like, so that the etch process 206 may be reliably stopped on the material system 255A without undue material erosion. Consequently, after finishing the etch process 206, the opening 255O may extend down to the material system 255A and may have the increased width or gate length 255X at the top area 255T, as previously explained. Hence, the further processing, i.e., the deposition of materials into the opening 255O, may be accomplished on the basis of a superior cross-sectional shape of the opening 255O.

Figure 2E:
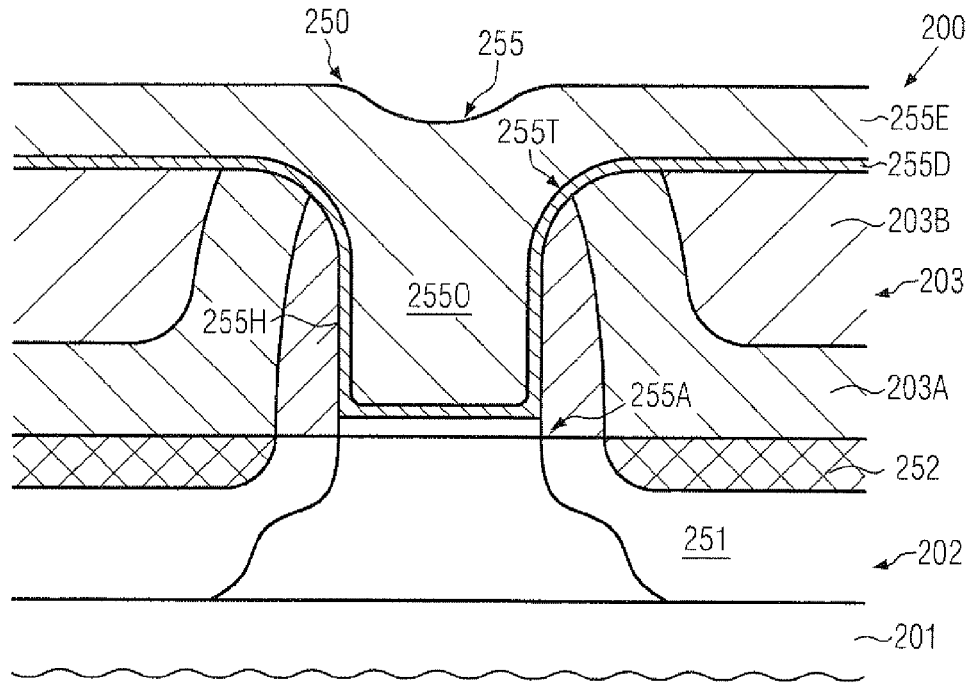

FIG. 2e schematically illustrates the semiconductor device 200 in a further advanced manufacturing stage. As illustrated, one or more material layers 255D may be deposited so as to reliably cover the interior of the opening 255O and thus the material system 255A, when the system 255A may have the required characteristics in terms of material composition and the like. It should be appreciated that, in other cases, the material layer 255D may comprise a plurality of individual material layers in order to also adjust the dielectric characteristics of the material system 255A, which may be completely or at least partially removed after the etch process 206 (FIG. 2d), if desired. For example, the material layers 255D may comprise a high-k dielectric material if such a material has not yet been provided in the material system 255A. In this case, a portion of a conventional dielectric material may be replaced by a high-k dielectric material. In other cases, the layer 255D may comprise at least one metal-containing material, for instance in the form of titanium nitride, tantalum nitride and the like, in combination with a work function adjusting species, which may be positioned at or incorporated into the material system 255A, for instance on the basis of a heat treatment and the like. Thus, depending on the composition of the one or more material layers 255D, any appropriate deposition technique may be applied wherein the superior cross-sectional shape of the opening 255O may provide superior uniformity of the thickness of the layer 255D along sidewall portions 255H of the opening 255O. In some illustrative embodiments, a thickness of the layer 255D comprising a work function adjusting species, such as lanthanum, aluminum and the like, may vary by approximately less than ten percent along the vertical sidewall portions 255H. Moreover, an increase in thickness at the top area 255T may also be less pronounced compared to conventional strategies, wherein a corresponding increased thickness may not negatively affect the further processing for filling in an electrode material 255E. Consequently, the opening 255O may be reliably filled with the electrode material 255E, wherein the material layer 255D comprising the work function adjusting species may also be deposited with superior thickness uniformity, at least at the vertical sidewall faces 255H, thereby also achieving superior uniformity in thickness on the material system 255A. It should be appreciated that the electrode material 255E, for instance in the form of aluminum or any other metal-containing materials or highly conductive semiconductor materials and the like, may be deposited on the basis of any appropriate deposition technique, such as sputter deposition, CVD, electrochemical deposition or any combination thereof. Furthermore, it is to be appreciated that other circuit elements may receive the material system 255D and 255E, however on the basis of less critical process conditions, as previously indicated with reference to the device 100. In other cases, different materials may have to be provided in transistors of different conductivity type, thereby possibly requiring a corresponding masking and removal strategy in order to obtain a desired work function species for N-channel transistors and P-channel transistors, respectively. Also, in these cases, the superior cross-sectional shape of the gate opening 255O may provide enhanced process uniformity.

Figure 2F:
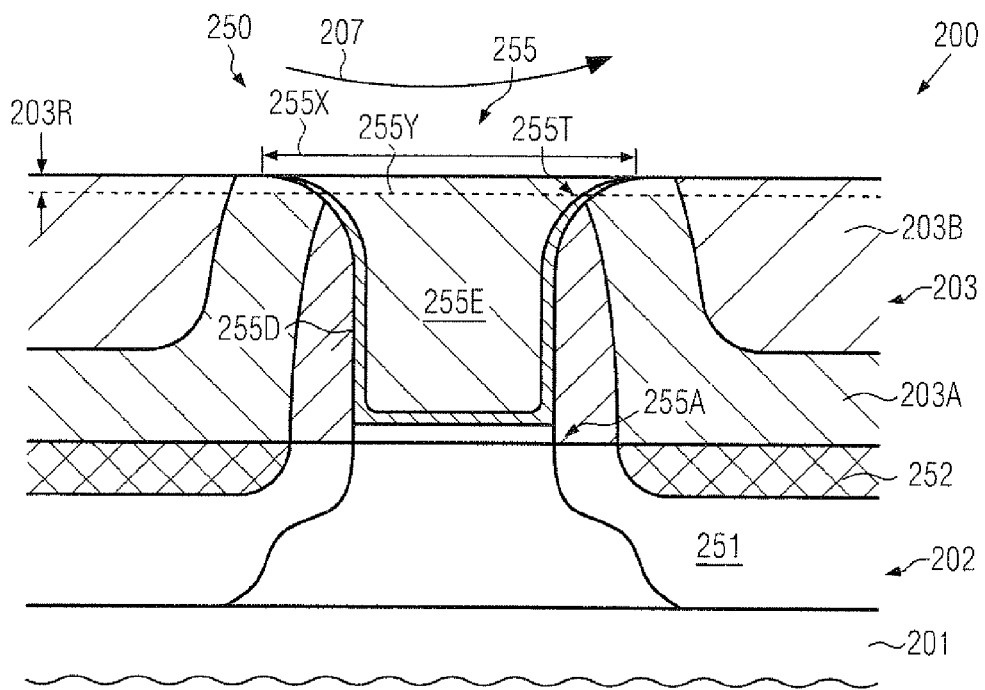

FIG. 2*f* schematically illustrates the semiconductor device 200 during a material removal process 207, in which excess material of the layers 255E, 255D (FIG. 2*e*) may be removed. For example, the process 207 may be performed as a CMP process, possibly on the basis of different process parameters and conditions in order to reliably remove any conductive materials from the dielectric material 203. Consequently, the gate electrode structure 255 may be provided as an electrically insulated component, wherein the width 255X at the top area 255T and thus the corresponding gate length at the top of the gate electrode structure 255 may be determined on the basis of process parameters of the process 207. For instance, if a pronounced increased gate length 255X may be considered inappropriate, for instance in view of avoiding leakage current paths upon forming contact elements in a later manufacturing stage, an increased degree of material removal, as indicated by 203R, may be applied so as to reduce the resulting gate height and thus reduce the length of the gate electrode structure 255 at the top area 255T. This degree of freedom can also be used to remove the eroded top part of the gate, reducing the risk of shorts between the gate electrode and neighboring contacts. As illustrated, upon selecting a desired degree of material erosion 203R, a significantly reduced length 255Y at the top area 255T may be achieved, thereby enabling a reliable electrical insulation, in particular in densely packed device regions in which a distance between neighboring gate electrode structures may be 100 nm and less.

Consequently, after completing the removal process 207, the transistor 250 may comprise the gate electrode structure 255 having the desired superior electrical characteristics, for instance in terms of conductivity and capacitive coupling, wherein superior uniformity of the device characteristics, for instance in terms of threshold voltage variability and the like, may be accomplished due to a superior uniformity of the layer 255D and a reliable filling in of the electrode material 255E.

Figure 2G:
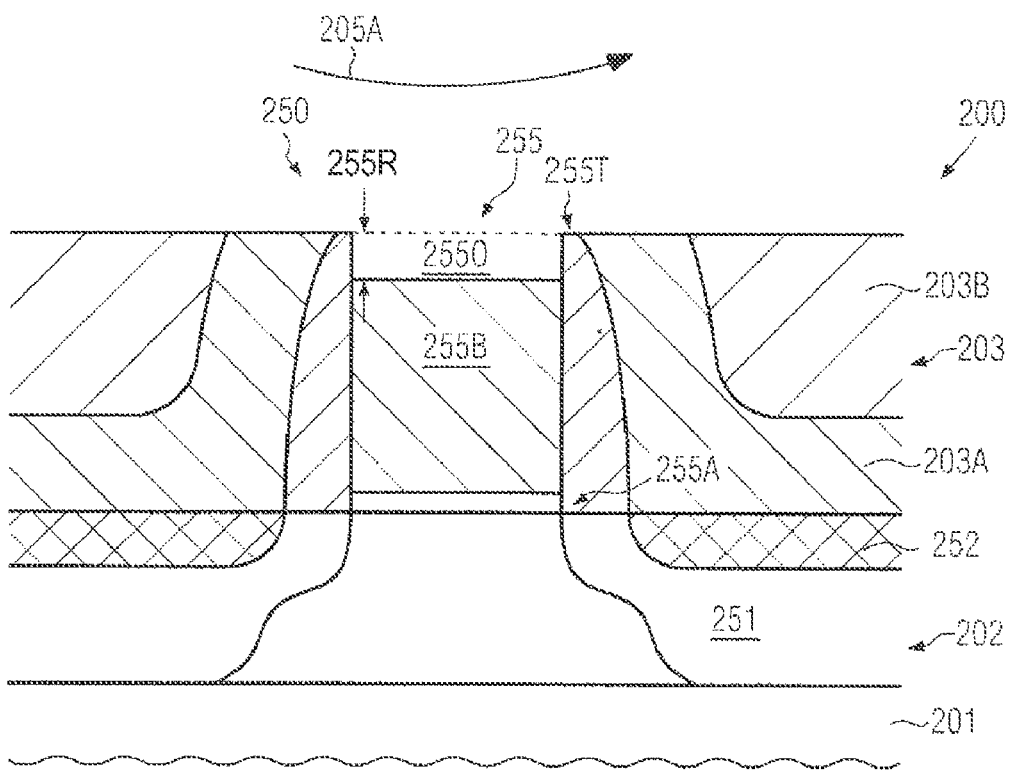

FIG. 2*g* schematically illustrates the semiconductor device 200 according to further illustrative embodiments in which the material erosion and thus the corner rounding at the top area 255T may comprise a polishing process 205A. For this purpose, the device 200 may be processed, as previously described, and an opening 255O may be formed on the basis of an etch process, such as a plasma assisted process, a wet chemical etch process and the like. In this case, the degree of recessing, as indicated by 255R, of the opening 255O may be selected less compared to the previously described embodiments in order to provide a high degree of mechanical stability during the polishing process 205A. Consequently, during the polishing process 205A, the mechanical integrity of the gate electrode structure 255 may be maintained, while at the same time an increased degree of material erosion at the corners of the openings 255O may occur, thereby obtaining a desired corner rounding. After the polishing process 205A, a further cleaning process may be performed to remove any byproducts of the polishing process 205A and thereafter a further etch process, such as a wet chemical etch process, may be performed in order to completely remove the material 255B. In other illustrative embodiments, after forming the opening 255O having the desired depth 255R, a planarization material may be provided, for instance in the form of a polymer material, and may subsequently be removed during the process 205A with a significantly higher removal rate compared to the dielectric material 203. In this manner, during the process 205A, the planarization material in the opening 255O may be recessed, thereby also enabling a certain degree of corner rounding while nevertheless providing superior integrity of the entire gate electrode structure 255. After a certain degree of corner rounding is obtained, any material residues may be efficiently removed by wet chemical processes and the remaining portion of the material 255B may be removed. Thereafter, the further processing may be continued as described above. Consequently, by applying the planarization process 205A, exposure of the device 200 to reactive particle bombardments may be avoided or at least reduced, which may provide superior integrity of the dielectric material 203.

As a result, the present disclosure provides semiconductor devices and manufacturing techniques in which a desired corner rounding or tapering of a gate opening may be accomplished in an intermediate phase of removing the placeholder electrode material so that, after removing a first portion thereof, the second portion may reliably cover and thus protect any sensitive underlying materials, thereby enabling a desired degree of increasing an initial width of the opening. Therefore, superior process conditions may be obtained upon filling in further materials, such as a work function adjusting species and an electrode material. The material erosion in the intermediate state of removing the placeholder material may be accomplished on the basis of a plasma assisted etch process, a particle bombardment, a polishing process and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first portion of an opening in a gate electrode structure of a transistor by removing a first portion of a conductive placeholder electrode material of said gate electrode structure, said first portion of said opening having a width at a top area of said opening;
    after removing said first portion of said conductive placeholder electrode material, increasing said width of said first portion of said opening at a top area thereof in the presence of a second portion of said conductive placeholder electrode material;
    removing said second portion of said conductive placeholder electrode material;
    forming a material layer in said opening having said increased width at the top area thereof, said material layer comprising a work function adjusting species; and
    filling said opening with a conductive electrode material.

2. The method of claim 1, wherein increasing a width of said first portion of said opening comprises performing a plasma assisted etch process.

3. The method of claim 2, wherein forming a first portion of said opening comprises performing said plasma assisted etch process so as to remove said first portion of said conductive placeholder electrode material and to round corners of said opening.

4. The method of claim 2, wherein removing said first portion of said conductive placeholder electrode material comprises performing a first wet chemical etch process.

5. The method of claim 1, wherein removing said second portion of said conductive placeholder electrode material comprises performing a wet chemical etch process.

6. The method of claim 5, wherein performing said wet chemical etch process comprises using a conductive cap layer formed above a gate dielectric material as an etch stop material.

7. The method of claim 1, wherein filling a conductive electrode material into said opening comprises depositing said conductive electrode material so as to overfill said opening and removing excess material by performing at least one of an etch process and a polishing process.

8. The method of claim 7, wherein removing excess material comprises removing material of said conductive electrode material and a portion of a dielectric material laterally delineating said opening so as to adjust a height of said gate electrode structure.

9. The method of claim 1, further comprising forming a high-k dielectric material at least at the bottom of said opening prior to filling said conductive electrode material into said opening.

10. The method of claim 1, further comprising forming a high-k dielectric material of said gate electrode structure prior to forming said opening.

11. The method of claim 1, further comprising performing a cleaning process on said second portion of said conductive placeholder electrode material after increasing said width.

12. A method, comprising:
    removing a first portion of a conductive placeholder electrode material of a gate electrode structure of a transistor to expose inside corner areas of an insulating material laterally enclosing said conductive placeholder electrode material;
    after removing said first portion of said conductive placeholder electrode material, rounding said inside corner areas of said insulating material in the presence of a second portion of said conductive placeholder electrode material;
    removing said second portion by performing a wet chemical etch process so as to form an opening after rounding said inside corner areas; and
    forming a gate electrode in said opening.

13. The method of claim 12, wherein rounding said inside corner areas comprises performing a plasma assisted etch process.

14. The method of claim 12, wherein rounding said inside corner areas comprises performing a particle bombardment.

15. The method of claim 14, wherein performing said particle bombardment comprises performing an ion sputtering process.

16. The method of claim 12, further comprising performing a cleaning process on an exposed surface of said second portion prior to performing said wet chemical etch process.

17. The method of claim 12, wherein removing said first portion of said conductive placeholder electrode material comprises performing a first wet chemical etch process.

18. The method of claim 12, wherein removing said first portion of said conductive placeholder electrode material comprises performing a plasma based etch process.

19. The method of claim 18, wherein performing said plasma based etch process comprises adapting at least one process parameter of said plasma based etch process so as to control a degree of material erosion at said corner areas.

* * * * *